(12) United States Patent
Zhang et al.

(10) Patent No.: US 10,354,707 B2
(45) Date of Patent: Jul. 16, 2019

(54) COMPOSITE SEED LAYER

(71) Applicant: Headway Technologies, Inc., Milpitas, CA (US)

(72) Inventors: Kunliang Zhang, Fremont, CA (US); Ruhang Ding, Pleasanton, CA (US); Min Li, Fremont, CA (US); Wenyu Chen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 606 days.

(21) Appl. No.: 15/098,913

(22) Filed: Apr. 14, 2016

(65) Prior Publication Data

US 2017/0301855 A1 Oct. 19, 2017

(51) Int. Cl.
*G11C 11/16* (2006.01)
*H01L 43/08* (2006.01)
*H01L 43/10* (2006.01)
*H01L 43/12* (2006.01)

(52) U.S. Cl.
CPC ............ *G11C 11/161* (2013.01); *H01L 43/08* (2013.01); *H01L 43/10* (2013.01); *H01L 43/12* (2013.01)

(58) Field of Classification Search
CPC ..................................................... G11C 11/16
See application file for complete search history.

(56) References Cited

U.S. PATENT DOCUMENTS

| | | | |
|---|---|---|---|
| 8,133,601 B2 | 3/2012 | Kurokawa et al. | |
| 8,541,855 B2 | 9/2013 | Jan et al. | |
| 8,860,156 B2 | 10/2014 | Beach et al. | |
| 9,230,571 B1 | 1/2016 | Chen et al. | |
| 2014/0103469 A1 | 4/2014 | Jan et al. | |
| 2014/0145792 A1 | 5/2014 | Wang et al. | |
| 2014/0306302 A1* | 10/2014 | Jan ........................... | H01L 43/10 257/421 |
| 2015/0008547 A1 | 1/2015 | Pi et al. | |

OTHER PUBLICATIONS

"Microwave Assisted Magnetic Recording," by Jian-Gang Zhu et al. IEEE Transactions on Magnetics, vol. 44, No. 1, Jan. 2008, pp. 125-131.
Co-pending US Patent HT15-006, U.S. Appl. No. 14/949,232, filed Nov. 23, 2015, "Multilayer Structure for Reducing Film Roughness in Magnetic Devices," by Jian Zhu et al., 34 pgs.

* cited by examiner

*Primary Examiner* — Marvin Payen
(74) *Attorney, Agent, or Firm* — Saile Ackerman LLC; Stephen B. Ackerman

(57) ABSTRACT

A seed layer stack with a smooth top surface having a peak to peak film thickness variation of about 0.5 nm is formed by sputter depositing a second seed layer on a first seed layer that is Mg, MgN, or an alloy thereof where the second seed layer has a bond energy substantially greater than that of the first seed layer. The second seed layer may be Ta or NiCr. In some embodiments, an uppermost seed layer that is one or both of Ru and Cu is deposited on the second seed layer. Higher coercivity (Hc) and perpendicular magnetic anisotropy (Hk) is observed in an overlying ferromagnetic layer than when a prior art seed layer stack is employed. The first seed layer has a thickness from 2 to 20 Angstroms and has a resputtering rate about 2 to 40 times that of the second seed layer.

24 Claims, 4 Drawing Sheets

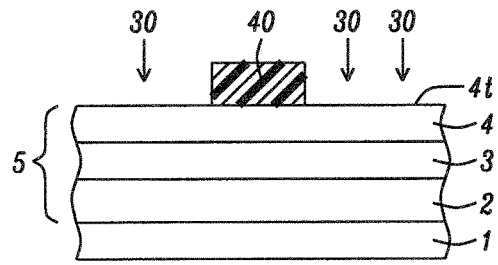
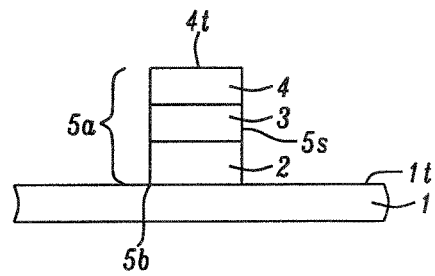
FIG. 1a          FIG. 1b
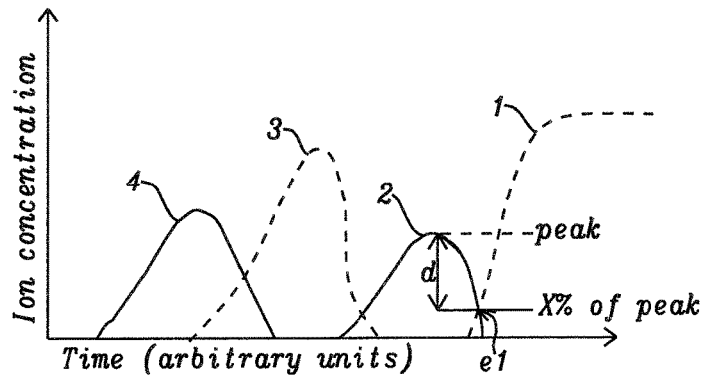
FIG. 2 Prior Art
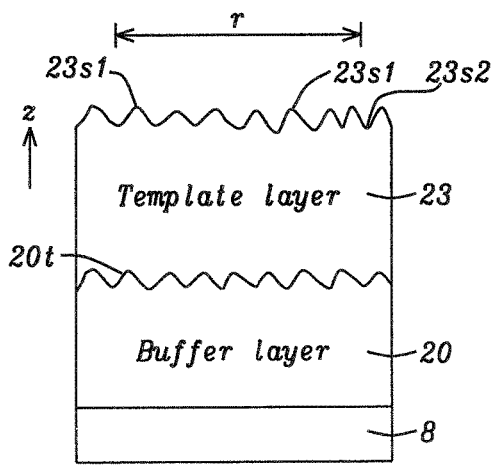
FIG. 3 Prior Art

COMPOSITE SEED LAYER

RELATED PATENT APPLICATIONS

This application is related to the following: Ser. No. 14/949,232; filing date Nov. 23, 2015; U.S. Pat. Nos. 9,230,571; and 8,541,855; all assigned to a common assignee and herein incorporated by reference in their entirety.

TECHNICAL FIELD

The present disclosure relates to magnetic devices that utilize a seed layer comprising Mg or an alloy thereof to provide improved etch end point control when patterning the magnetic devices thereby improving the lifetime of the device and enhancing coercivity (Hc) and perpendicular magnetic anisotropy (PMA) in overlying magnetic layers.

BACKGROUND

Magnetoresistive Random Access Memory (MRAM) has a read function based on a tunneling magnetoresistive (TMR) effect in a magnetic tunnel junction (MTJ) stack of layers wherein a tunnel barrier is formed between a free layer and a reference layer. The free layer serves as a sensing layer by switching the direction of its magnetic moment in response to external fields (media field) while the reference layer has a fixed magnetic moment. The electrical resistance through the tunnel barrier (insulator layer) varies with the relative orientation of the free layer moment compared with the reference layer moment and thereby provides an electrical signal that is representative of the magnetic state in the free layer. In MRAM, the MTJ is formed between a top conductor (electrode) and bottom conductor. When a current is passed through the MTJ, a lower resistance is detected when the magnetization directions of the free and reference layers are parallel ("0" memory state), and a higher resistance is noted when they are antiparallel ("1" memory state). The TMR ratio is dR/R where R is the minimum resistance of the MTJ, and dR is the difference between the lower and higher resistance values. The tunnel barrier is typically about 10 Angstroms thick so that a current through the tunnel barrier can be established by a quantum mechanical tunneling of conduction electrons. When the MTJ is a sensor in a magnetic read head that is used as the read-back element in hard disk drives (HDD), a higher TMR ratio allows a faster read out of the sense current.

MTJ elements wherein one or both of the free layer and reference layer have perpendicular magnetic anisotropy (PMA) are preferred over their counterparts that employ in-plane anisotropy because the former has an advantage in a lower writing current for the same thermal stability, and better scalability for higher packing density which is one of the key challenges for future MRAM applications. The ability to maintain free layer magnetization direction during an idle period is called data retention or thermal stability. A MTJ typically has a bottommost layer called a seed layer, which is a non-magnetic metal, or alloy that is employed to induce or enhance PMA in overlying magnetic layers, and to improve film thickness uniformity in the tunnel barrier.

A MTJ with magnetic layers having PMA that is induced or enhanced with a seed layer is found in read head sensors, thermally assisted magnetic recording (TAMR), and microwave assisted magnetic recording (MAMR) devices. MAMR is described by J-G. Zhu et al. in "Microwave Assisted Magnetic Recording", IEEE Trans. Magn., vol. 44, pp. 125-131 (2008). Spin transfer (spin torque) devices in MRAM and in MAMR writers are based on a spin-transfer effect that arises from the spin dependent electron transport properties of ferromagnetic-spacer-ferromagnetic multilayers. When a spin-polarized current passes through a magnetic multilayer in a CPP (current perpendicular to plane) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer, or drive the magnetization into stable dynamics, if the current density is sufficiently high.

According to one MAMR design that features a spin torque oscillator (STO) device between a main pole and a write shield (not shown), the STO has a seed layer contacting the main pole, and a spin polarization (SP) layer, tunnel barrier, and oscillation layer (OL) sequentially formed on the seed layer. A direct current or pulsed current flowing through the STO stack from the main pole to the write shield is converted to spin polarized current by the SP layer and interacts with the OL to cause the latter to oscillate with a large angle, and a frequency that generates a rf field on a nearby magnetic medium thereby assisting a magnetic field from the main pole to switch a magnetic bit during a write process. The seed layer may be advantageously used to enhance PMA in the SP layer and overcome the perpendicular demagnetization field within the SP layer and enable the SP layer to spin polarize the current directed to the OL.

Referring to FIG. 1a, when patterning a plurality of MTJs in magnetic devices, an etching step with ions 30 is employed to transfer a mask shape in a photoresist layer 40 through a MTJ stack with an arbitrary number of layers designated as 2-4 formed on a substrate 1 that may be a bottom electrode or main pole. As shown in FIG. 1b after the photoresist layer is removed, the resulting sidewall 5s in the MTJ 5a preferably stops on a top surface 1t of the substrate. The etch process is monitored by a method such as secondary ion mass spectrometry (SIMS) that detects the secondary ions and neutral species produced in the etch chamber. As each layer 2-4 is removed by the etch process, ions that are characteristic of a ferromagnetic layer or of a seed layer, for example, are identified by a particular m/e signal where m is the mass of the ion and e is the charge.

Referring to FIG. 2, a curve is generated on a plot of time vs. ion concentration for each layer 2-4 by a SIMS end point detector or the like. An end point signal is used to determine when the etch process has reached the top surface 1t of substrate 1. The end point e1 of the etch may be set where there is a signal decrease d from a peak intensity to x % of the peak intensity for layer 2 which is typically a seed layer. Ideally, at time e1 there is no seed layer remaining in regions not protected by the photoresist layer, and the top surface 1t remains unetched. Unfortunately, the end point signal is often not reliable because the seed layer signal does not have a strong peak intensity that makes a decrease to the x % mark at point e1 difficult to determine. As a result, the etch process easily goes to an overetch condition (right of e1) and undesirably removes a top portion of the substrate, or does not completely remove layer 2 (underetch condition to left of e1). In either case, magnetic performance of the MTJ is degraded and device reliability suffers.

As MTJ devices decrease in diameter to 50 nm or below in order to satisfy higher density requirements, a more precise control is needed for the etch process that forms MTJ sidewalls and defines the shape of the device. Currently, there is a significant signal to noise (S/N) ratio in the detection method that determines the etching end point. As a result, there is often an overetch or underetch condition of up to +/−20 Angstroms in establishing a bottom 5b of sidewall 5s in FIG. 1b that causes wafer to wafer variability in device performance. An improved film stack is desired to provide better process control during fabrication of magnetic devices described herein.

SUMMARY

One objective of the present disclosure is to provide a multilayer MTJ stack in a magnetic device that enables improved process control during an etch process where MTJ sidewalls are formed on a substrate.

A second objective of the present disclosure is to provide a MTJ stack according to the first objective that also has a seed layer, which enhances Hc and the perpendicular magnetic anisotropy field (Hk) in an overlying magnetic layer.

According to one embodiment of the present disclosure, these objectives are achieved by configuring a MTJ stack of layers with a bottommost seed layer. In particular, the seed layer is a multilayer wherein a lower layer that contacts the substrate is Mg, MgN, or a Mg alloy with a metal that is one of Al, Ti, Ta, Hf, Cr, Zr, Nb, or Zn. The seed layer stack may have a Mg/Ta/Cu, Mg/NiCr/Cu, Mg/Ta/Ru, Mg/NiCr/Ru, or Mg/Ta/Ru/Cu configuration or one of the aforementioned configurations where Mg is replaced by a Mg alloy. The MTJ stack encompasses bottom spin valve, top spin valve, and dual spin valve structures wherein a tunnel barrier is formed between a reference layer (RL) and a free layer (FL). Also, a capping layer may be included as the uppermost layer in the MTJ stack.

In a second embodiment, the Mg, MgN, or Mg alloy seed layer is formed on a bottommost Ta or NiCr seed layer, and there is a third seed layer such as Ru or Cu formed on the Mg or Mg alloy layer to give a Ta/Mg/Ru, Ta/Mg/Cu, NiCr/Mg/Ru, or NiCr/Mg/Cu seed layer stack, for example. The Mg or Mg alloy seed layer provides at least two advantages over the prior art. First, the Mg containing layer provides a strong m/e signal in the SIMS end point detector that is at least an order of magnitude greater in intensity than observed for a typical seed layer such as Ta. Accordingly, the end point for the etch process is more easily detected and the margin of error in establishing a bottom point in the MTJ sidewall is reduced to about +/−2 Angstroms. Secondly, the Mg or Mg alloy layer has an uneven top surface after deposition with a peak to peak thickness variation of around 2 nm. A key feature is the overlying layer is selected to have a lower resputtering rate than that of Mg. During deposition of the overlying seed layer, a portion of the Mg or Mg alloy layer top surface is removed due to a high resputter rate and is replaced by the overlying seed layer that has a more uniform top surface. After deposition of the low resputtering rate layer, the Mg or Mg alloy layer and each of the overlying seed layers has a smooth top surface with a peak to peak thickness variation of about 0.5 nm. The combination of the Mg or Mg alloy layer and the overlying low resputtering rate layer is called a "smoothing layer".

The uppermost layer in the seed layer stack serves as a template layer to promote perpendicular magnetic anisotropy in an overlying free layer or reference layer. Ru and Cu are preferred as the uppermost seed layer since they enable better exchange coupling in the overlying ferromagnetic layer. The uppermost seed layer has a peak to peak thickness variation of about 0.5 nm over a range of 100 nm compared with a peak to peak variation of about 2 nm over a range of 100 nm in prior art seed layer films as determined by transmission electron microscope (TEM) measurements.

After all layers in the MTJ are laid down, an anneal process up to 400° C. for 30 minutes may be employed to further improve PMA properties and thereby increase Hc and Hk in the magnetic layers. Thereafter, a conventional process sequence is performed to fabricate a plurality of MTJ devices each having a sidewall, and a top electrode on each of the MTJ devices.

BRIEF DESCRIPTION OF THE DRAWINGS

FIGS. 1a-1b show a conventional process of etching a stack of MTJ layers to form a MTJ device with sidewalls that stop on a substrate.

FIG. 2 depicts a conventional end point detect curve where an end point is set at a time corresponding to a certain decrease in a maximum peak intensity during etching of a seed layer on a substrate.

FIG. 3 is a cross-sectional view of a prior art seed layer stack where a rough top surface in the bottom seed layer is reproduced in the uppermost seed layer.

DETAILED DESCRIPTION

Figure 4:
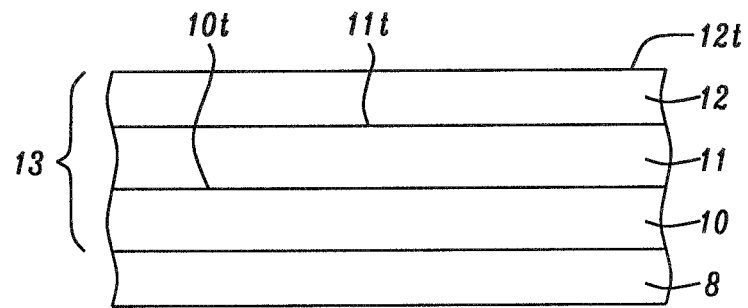
FIG. 4 is a cross-sectional view of a seed layer stack comprising Mg or a Mg alloy and formed according to a first embodiment of the present disclosure.

The present disclosure is a MTJ device having a seed layer comprising a Mg, MgN, or Mg alloy layer that enables one or more seed layers formed on the first seed layer to have improved film thickness uniformity. The MTJ device may be used in a MRAM or spin-torque transfer MRAM (STT-MRAM), in spintronic devices such as MAMR, TAMR, and spin torque oscillators (STO), and in various spin valve designs including those found in read head sensors. The seed layer stack generates improved Hc and Hk in an overlying magnetic layer with PMA, and provides a stronger SIMS end point signal during a MTJ etch process which results in better process control when forming MTJ sidewalls on a substrate.

Referring to FIG. 3, a cross-sectional view is shown of a seed layer stack formerly fabricated by the inventors. The seed layer is formed on a substrate 8 that may be a bottom electrode in a MRAM device, a bottom shield in a read head sensor, or a main pole layer in a STO device, and has a bottom layer called a buffer layer 20 that is used for good adhesion to the substrate. Ta or TaN are commonly selected for the buffer layer, which tends to have considerable roughness at its top surface 20t. An upper template layer 23 made of NiCr, NiFeCr, or the like is conformally deposited on the buffer layer, and has a (111) crystal structure in order to promote a fcc (111) crystal orientation in an overlying ferromagnetic layer (not shown). As a result, the significant unevenness in top surface 20t is essentially duplicated in the top surface of the template layer where peaks 23s1 are separated by valleys 23s2 in the film. The substantial non-uniformity in the template layer is associated with a loss in PMA in the overlying ferromagnetic layer such as a reference layer, free layer, or dipole layer during high temperature processing. Peak to peak thickness variation in the z-axis direction between peaks 23s1 is about 2 nm over a radius r of 100 nm.

We disclosed in related U.S. Pat. No. 8,541,855 how a Hf/NiCr or Hf/NiFeCr seed layer improves PMA in an overlying $(Co/Ni)_n$ multilayer where n is from 2 to 50. Furthermore in related application Ser. No. 14/949,232, we described a resputtering effect where deposition of a low resputtering rate material such as CoFeB on a high resputtering rate material that is Mg improves film thickness uniformity in the CoFeB seed layer and overlying layers. Now we have discovered an improved seed layer stack that not only enhances PMA in an overlying $(Co/Ni)_n$ laminate or the like, but achieves better process control during an etch process to generate a plurality of MTJ devices having sidewalls that stop on a substrate. In particular, Mg and alloys thereof generate a m/e signal during a SIMS measurement that is an order of magnitude greater in intensity than typical metals and alloys employed for a bottom seed layer thereby enabling the etch process in forming MTJ sidewalls to stop within +/−2 Angstroms of the substrate surface rather than +/−20 Angstroms in the prior art.

According to a first embodiment depicted in FIG. 4, the seed layer stack 13 of the present disclosure includes a bottom layer 10 that is Mg, MgN, or a Mg alloy with a metal X that is one of Al, Ti, Ta, Hf, Cr, Zr, Nb, or Zn and wherein the X content is <20 atomic %. Layer 10 thickness is from 2 to 20 Angstroms, and preferably between 3 and 10 Angstroms. Above the bottom layer is a second seed layer 11 that is Ta, NiCr, or the like. The uppermost seed layer 12 is called a template layer and is Cu, Ru, or Ru/Cu, for example. Thus, the seed layer stack may have a Mg/Ta/Cu, Mg/NiCr/Cu, Mg/NiCr/Ru, Mg/Ta/Ru, or Mg/Ta/Ru/Cu configuration, or one of the aforementioned configurations where Mg is replaced by MgN or a Mg alloy as described earlier. A key feature is a so-called "smoothing layer" structure, which is the stack 10/11 where bottom layer 10 is made of a material with a high resputtering rate that is formed on substrate 8. Layer 11 has a lower resputtering rate than bottom layer 10 such that layer 10 has a resputtering rate from 2 to 40 times that of layer 11.

As defined herein, resputtering rate is related in part to bond energy, which is the energy needed to break apart bonded atoms. Therefore, a material with a low bond energy is easy to resputter and has a higher resputtering rate than a material with a higher bond energy. For example, the bond energy of Mg—Mg is 11.3 kJ/mol while the bond energy of Ta—Ta is 390 kJ/mol according to a table of values found in "Comprehensive Handbook of Chemical Bond Energies", Y. Luo, CRC Press, Boca Raton, Fla., 2007. It follows that the bond energy ratio between Mg and Ta is about 1:35 to give a resputtering rate for Mg that is about 35 times greater than that for Ta. In other words, the metal or alloy in the bottom seed layer preferably has a first bond energy that is substantially less than a second bond energy for the metal or alloy in layer 11.

A second important factor in determining resputtering rate is the atomic number (Z) of an element. In particular, materials in layer 10 are more easily displaced during deposition of layer 11 when the material for the second seed layer has a higher weight (larger Z value) than Mg or a Mg alloy selected for the bottom seed layer. Accordingly, a greater resputtering rate ratio (layer 10/layer 11) is achieved with a condition where layer 10 has both of a lower Z value and smaller bond energy than the material in layer 11.

Figure 10:
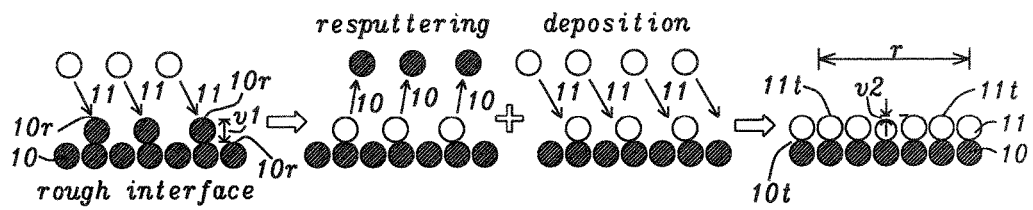
FIG. 10 depicts a process of sputter depositing an amorphous seed layer on a seed layer with a higher resputtering rate according to an embodiment of the present disclosure.

As a result of the resputtering rate difference, when the second seed layer is deposited as depicted in the deposition sequence found in FIG. 10, atoms of bottom layer 10 are displaced from a top surface of the first seed layer and are replaced by a more uniform film of second seed layer 11. The "as deposited" rough top surface 10r of the bottom seed layer with a peak to peak film thickness variation v1 becomes a smooth top surface 10t after the second seed layer with a lower resputtering rate is deposited thereon. Peak to peak thickness variation v2 between peaks 11t has been observed to be only 0.5 nm over a 100 nm radius r, and is substantially less than a peak to peak thickness variation v1 of about 2 nm over a 100 nm radius for top surface 10r prior to deposition of layer 11.

Returning to FIG. 4, top surfaces 10t, 11t, 12t of layers 10, 11, and 12, respectively, have a smooth top surface each with a peak to peak thickness variation proximate to 0.5 nm over a 100 nm radius. It should be understood that the template seed layer 12 is conformally deposited on the smooth top surface 11t and thereby the film thickness variation of top surface 11t is essentially reproduced in top surface 12t. As stated previously, the term "smooth" when referring to a top surface 12t may be described in terms of a peak to peak variation over a radius of 100 nm. In this case, a TEM measurement indicates a peak to peak thickness variation in top surface 12t of about 0.5 nm, which represents a substantial improvement over the 2 nm value for peak to peak variation between peaks 23s1 of the template layer in the FIG. 1 reference.

Figure 5:
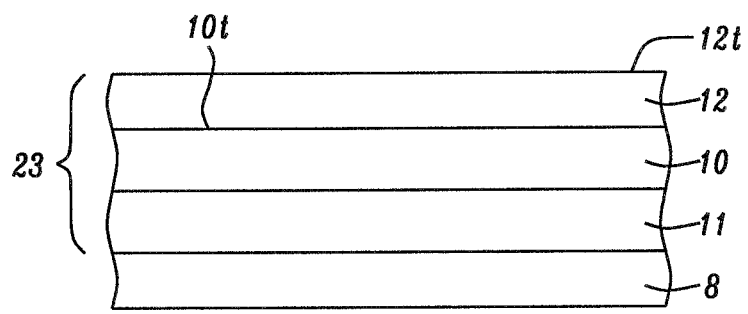
FIG. 5 is a cross-sectional view of the seed layer stack comprising Mg or a Mg alloy and formed according to a second embodiment of the present disclosure.

In a second embodiment illustrated in FIG. 5, the seed layers are retained from the first embodiment but are formed in a different sequence such that the Mg or Mg alloy layer 10 is used as a second layer in a seed layer stack 23 while layer 11 serves as the bottommost layer on substrate 8. Seed layer 12 remains as the uppermost layer in the seed layer stack. Seed layer configurations according to the second embodiment are NiCr/Mg/Ru, NiCr/Mg/Cu, Ta/Mg/Ru, Ta/Mg/Cu, Ta/Mg/Ru/Cu, or one of the aforementioned stacks where MgN, or an alloy of Mg with one of Al, Ti, Ta, Hf, Cr, Zr, Nb, or Zn is selected to replace Mg. In this case, the smoothing layer is the upper two layers 10, 12 in the seed layer stack, and seed layer 12 is a layer with a low resputtering rate relative to the Mg or Mg alloy layer that results in a smooth top surface 12t. Note that the bond energy of Cu—Cu is 210 kJ/mol, and that of Ru—Ru is 193 kJ/mol in the "Comprehensive Handbook of Chemical Bond Energies" reference. Therefore, Mg in layer 10 is expected to have a resputtering rate of about 15-20× greater than that of Cu or Ru in layer 12. The smooth top surface 12t is attributed to maintaining PMA in an overlying ferromagnetic layer after processing at temperatures as high as 400° C. as supported by data provided in a later section.

Figure 6:
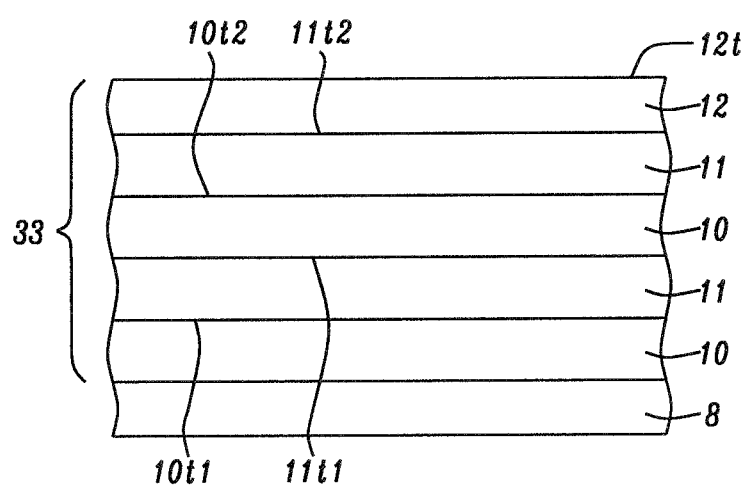
FIG. 6 is a cross-sectional view of the seed layer stack wherein a smoothing layer is repeated according to a third embodiment of the present disclosure.

The present disclosure also anticipates the smoothing layer stack 10/11 in FIG. 4 may be repeated at least once to give a laminate consisting of alternating layers 10 and 11 as illustrated in FIG. 6. In one embodiment, the seed layer stack 33 has five sub-layers in a 10/11/10/11/12 sequence. In some embodiments, the first layer 10 formed on substrate 8 may have a different composition than in the second (middle) layer 10. However, each layer 10 is comprised of one of Mg, MgN, or a Mg alloy with one of Al, Ti, Ta, Hf, Cr, Zr, Nb, or Zn. Likewise, the first layer 11 (second sub-layer) may have a different composition than in the second layer 11 (fourth sub-layer) in the seed layer stack. For example, both layers 11 may be Ta or NiCr. Optionally, a first layer 11 is Ta while a second layer 11 is NiCr. In this embodiment, all top surfaces 10t1, 11t1, 10t2, 11t2, 12t of the seed layers are considered to be "smooth" with a peak to peak thickness variation proximate to 0.5 nm. A first smoothing layer is formed by first sub-layer 10 and second sub-layer 11 with top surfaces 10t1, 11t1, respectively. A second smoothing layer consists of third sub-layer 10 and fourth sub-layer 11 having top surfaces 10t2 and 11t2, respectively.

Figure 7:
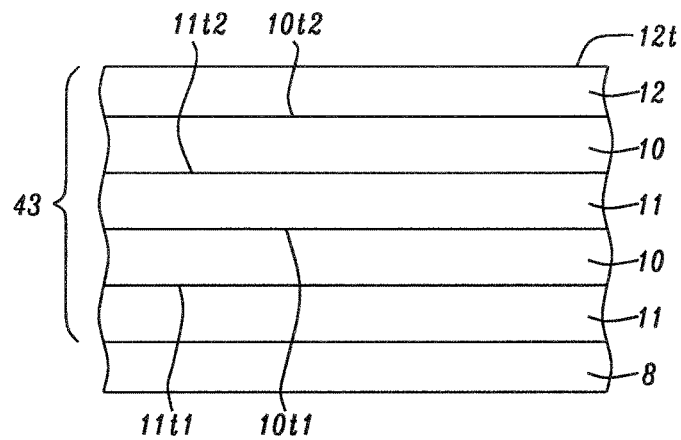
FIG. 7 is a cross-sectional view of the seed layer stack wherein a smoothing layer is repeated according to a fourth embodiment of the present disclosure.

In an alternative embodiment depicted in FIG. 7, the seed layer stack in FIG. 5 is repeated to give a laminate consisting of alternating layers 11 and 10. According to the exemplary embodiment, the seed layer stack 43 has five sub-layers in a 11/10/11/10/12 sequence. Top surfaces 10t1, 11t2, 10t2, 12t of the seed layers are considered to be "smooth" with a peak to peak thickness variation proximate to 0.5 nm. It should be understood that a first smoothing layer consists of first sub-layer 10 and second sub-layer 11 having top surfaces 10t1 and 11t2, respectively. A second smoothing layer consists of second sub-layer 10 and template layer 12 with top surfaces 10t2, 12t, respectively.

The present disclosure also encompasses a magnetic tunnel junction (MTJ) element comprising a seed layer stack formed according to one of the embodiments described herein. In the exemplary embodiments, a bottom spin valve and top spin valve are depicted. However, the seed layer embodiments described herein may be implemented in other spin valve designs including a dual spin valve structure as appreciated by those skilled in the art.

Figure 8:
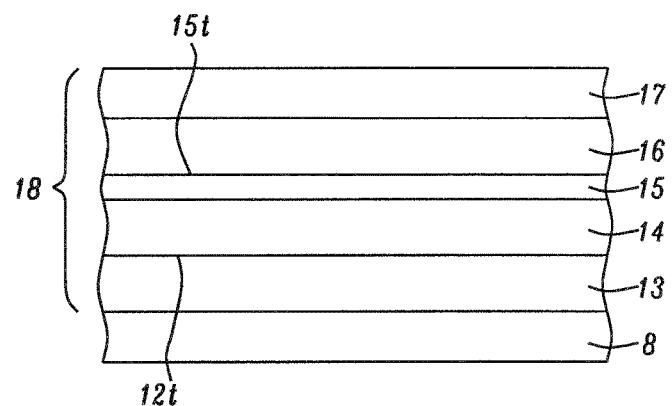
FIG. 8 is a cross-sectional view of a magnetic tunnel junction (MTJ) with a bottom spin valve configuration, and containing a seed layer stack formed according to an embodiment of the present disclosure.

Referring to FIG. 8, MTJ 18 is formed on a substrate 8 that may be a bottom electrode in a MRAM, a main pole layer in a STO device, or a bottom shield in a read head sensor. A bottom spin valve configuration is shown wherein the seed layer stack 13, a reference layer 14, tunnel barrier 15, free layer 16, and capping layer 17 are sequentially formed on the substrate. In one preferred embodiment, the reference layer (RL) has a synthetic antiparallel (SyAP) stack (not shown) with an AP2 layer contacting a top surface of the seed layer stack, a middle coupling layer such as Ru, and an uppermost AP1 layer. Preferably, both of the AP2 and AP1 layers have PMA wherein magnetization is aligned in a direction perpendicular to the planes of the MTJ layers. PMA in each of the AP2 and AP1 layers may be intrinsic and derived from a laminated stack $(Co/X)_n$ where X is Pt, Pd, Ni, NiCo, Ni/Pt, or NiFe, and n is from 2 to 30. In another aspect, CoFe or CoFeR may replace Co in the laminated stack and R is one of Mo, Mg, Ta, W, or Cr. The template layer with a smooth top surface described previously is formed as the uppermost layer in seed layer stack 13, and is advantageously used to maintain PMA in the reference layer after high temperature processing up to about 400° C. In alternative embodiments, seed layer stack 23 (or 33 or 43) is substituted for stack 13. In a STO device, the reference layer may serve as a spin injection layer (SIL) or a field generation layer (FGL).

There may be a transition layer (not shown) such as CoFe/Co or CoFeB/Co formed between the uppermost laminated layer in a $(Co/X)_n$ stack or the like and the tunnel barrier 15. According to one embodiment, the transition layer is formed between a (111) AP1 layer and a (100) MgO tunnel barrier, and is sufficiently thin to preserve the PMA property of the AP1 layer and yet thick enough to provide a high magnetoresistance (MR) ratio. Co is preferably used as the uppermost layer in a transition layer and forms an interface with the tunnel barrier layer since it is more resistant to oxidation than a CoFeB or CoFe layer. The transition layer, when present, is considered part of the reference layer 14 because of the magnetic character in the CoFe/Co and CoFeB/Co layers.

A tunnel barrier 15 is formed on the reference layer 14. The tunnel barrier is preferably an oxide, nitride, or oxynitride of one or more of Mg, MgZn, Ta, Ti, Zn, Al, or AlTi. The thickness and extent of oxidation in the metal oxide layer may be adjusted to tune the resistance×area (RA) value for the tunnel barrier. It is believed that the smoothness of the template layer top surface 12t is substantially duplicated in the overlying layers in MTJ 18 including top surface 15t in the tunnel barrier.

A free layer/capping layer stack is formed on the tunnel barrier. The free layer 16 may be selected from one of the laminated compositions described with respect to the reference layer. In an alternative embodiment, the free layer may be one or more of Co, Fe, CoFe, and alloys thereof with one or both of Ni and B. In another aspect, a moment diluting layer (L) such as Ta or Mg is inserted in one of the aforementioned metals or alloys to give a CoFeB/L/CoFeB configuration, for example. In a STO device, the free layer may be a SIL when the reference layer is a FGL, or may be a FGL when the reference layer serves as the SIL.

In some embodiments, the capping layer 17 is a metal oxide such as MgO or MgTaOx to enhance PMA in the free layer by inducing interfacial perpendicular anisotropy along an interface with the free layer. In other embodiments, the capping layer has an uppermost layer that is one or more of Ru and Ta to give a capping layer stack that is Ru/Ta/Ru or MgO/Ru/Ta, for example.

Figure 9:
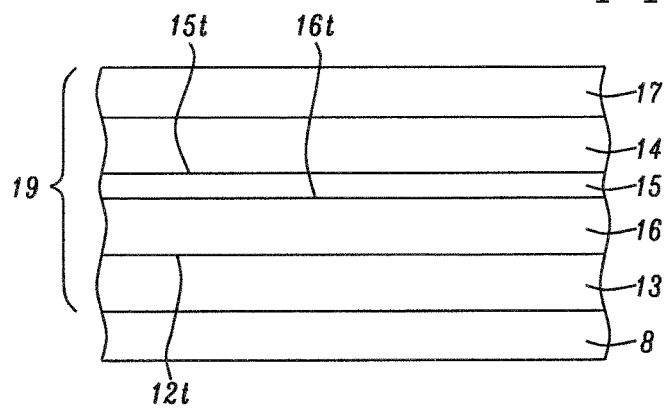
FIG. 9 is a cross-sectional view of a MTJ with a top spin valve configuration and a seed layer stack formed according to an embodiment of the present disclosure.

Referring to FIG. 9, a top spin valve embodiment shown as MTJ 19 is formed according to the present disclosure. Layers are retained from the bottom spin valve embodiment except the positions of the reference layer 14 and free layer 16 are switched. In this case, seed layer 13 (or 23 or 33 or 43) is formed on the substrate 8. Thereafter, the free layer 16, tunnel barrier 15, reference layer 14, and capping layer 17 are sequentially laid down on the seed layer. When the reference layer has a SyAP configuration, the AP1 layer contacts the tunnel barrier and AP2 layer is the uppermost layer in the reference layer stack. The free layer contacts the top surface 12t of the template layer in the seed layer stack and has a smooth top surface wherein the peak to peak thickness variation value associated with top surface 12t is believed to be substantially reproduced in the top surface 16t of the free layer, and top surface 15t of the tunnel barrier. The free layer may comprise two magnetic layers FL1 and FL2 (not shown) that are anti-ferromagnetically coupled through an anti-ferromagnetic coupling layer that is preferably Ru. Each of FL1 and FL2 layers may be a $(Co/X)_n$ laminate or the like as described earlier with respect to the reference layer, or one or both of FL1, FL2 may be one or more of Co, Fe, CoFe, and alloys thereof with one or both of Ni and B.

Above the capping layer 17, there is typically a top electrode (not shown) in a MRAM device, a top shield in a read head sensor, or a trailing shield in a STO device.

The present disclosure also encompasses a method of forming the seed layer stack in the embodiments disclosed herein. All layers in the MTJ stack including the seed layers may be deposited in a DC sputtering chamber of a sputtering system such as an Anelva C-7100 sputter deposition system or the like that includes ultra high vacuum DC magnetron sputter chambers with multiple targets and at least one oxidation chamber. Typically, the sputter deposition process for the seed layer stack including the high resputtering rate layer 10 and the low resputtering rate layer 11 involves an inert gas such as Ar and a base pressure between $5\times10^{-8}$ and $5\times10^{-9}$ torr. A lower pressure enables more uniform films to be deposited. The temperature in the sputter deposition chamber during deposition processes may vary from 100° K. to 400° C., and the forward power applied to one or more targets to form each seed layer is usually in the range of 20 W to 5000 W.

The tunnel barrier and metal oxide (when included) for the capping layer are prepared by first depositing a first metal layer, oxidizing the first metal layer with a natural oxidation (NOX) or radical oxidation (ROX) process, and then depositing a second metal layer on the oxidized first metal layer. During a subsequent annealing step, oxygen migrates into the second metal layer to oxidize the second metal. In some embodiments, one or more additional metal layers are deposited in the tunnel barrier stack and each oxidized by a NOX or ROX process before an uppermost metal layer is deposited and then oxidized by way of annealing to generate tunnel barrier 15.

Figure 11:
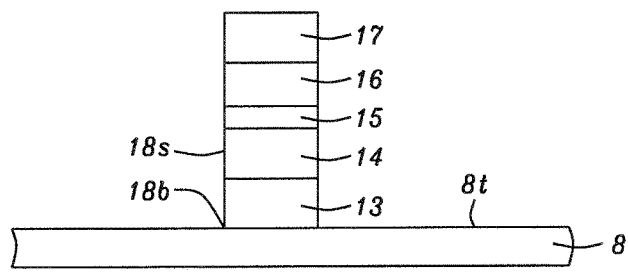
FIG. 11 is a cross-sectional view showing the MTJ in FIG. 8 after an etch process is performed to form a sidewall that stops on a substrate top surface.

Once all of the layers in the MTJ are formed, an annealing process is performed that is comprised of a temperature between 330° C. and 400° C. for a period of 1 minute to 10 hours. Thereafter, the spin valve stack may be patterned to form a plurality of MTJ elements on the substrate 8 by a well known photolithography and etch sequence. In an embodiment where the substrate is a bottom electrode, the bottom electrode in some cases is patterned simultaneously with the overlying spin valve stack to enable a higher density of patterned structures for advanced technology designs. Because of the high intensity m/e signal provided by Mg, MgN, or the Mg alloy in layer 10 during the formation of a MTJ sidewall with an etching process, a SIMS measurement during the etch process is more controlled such that a bottom 18b of sidewall 18s in FIG. 11 is able to be formed within +/−2 Angstroms of the substrate top surface 8t, a substantial improvement over the prior art where a sidewall bottom is controlled only within +/−20 Angstroms of a substrate top surface during an etch process.

EXAMPLE 1

To demonstrate the benefits of the present disclosure, a $(Co/Ni)_n$ multilayer stack with PMA where n=15 was fabricated on two different seed layers. The seed layer in the reference sample, which represents the FIG. 3 structure, has a Ta20/Ru50 stack formed on a first wafer where 20 and 50 represent the thickness in Angstroms of the Ta and Ru layers, respectively. A second seed layer taken from the first embodiment in FIG. 4 has a Mg10/Ta20/Ru50 stack formed on a second wafer where Mg is the high resputtering rate layer 10 and Ta is the low resputtering rate layer 11. Each wafer was annealed at 220° C. for 30 minutes. Thereafter, coercivity (Hc) and Hk were measured using a well known vibrating sample magnetometer (VSM) technique. The reference sample exhibited Hc=500 Oe and perpendicular magnetic anisotropy (Hk)=8000 Oe. With the Mg/Ta/Ru seed layer of the present disclosure, Hc increased to 750 Oe and Hk is enhanced to 10000 Oe.

Figure 12:
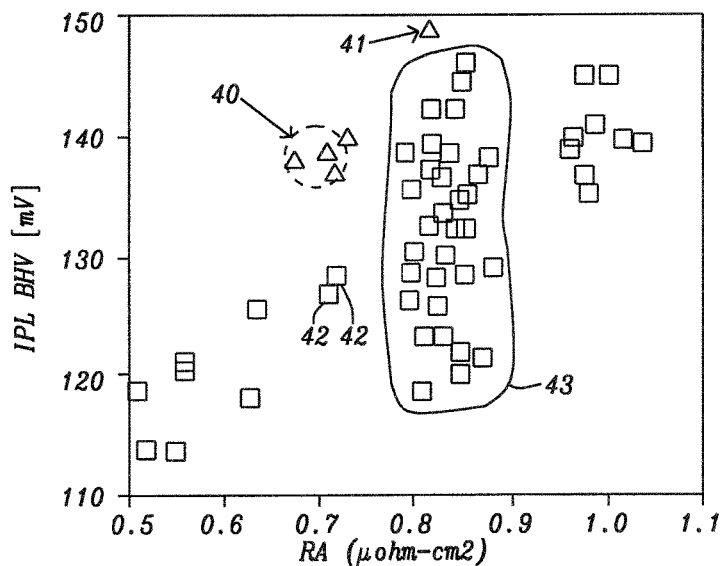
FIG. 12 is a plot of resistance×area (RA) vs. IPL (buffer head voltage) that indicates device lifetime improvement for a MTJ containing a seed layer according to an embodiment of the present disclosure.

The experiment was expanded to form a MTJ stack of layers on each wafer as represented by MTJ 18 in FIG. 8. In the reference sample, a Ta/Ru seed layer stack is used to replace seed layer stack 13. Otherwise, the same sequence of RL 14, tunnel barrier 15, free layer 16, and capping layer 17 is formed on the seed layer stack for both the reference MTJ, and the MTJ formed according to the first embodiment described previously. In both cases, the MTJ stack of layers is patterned to form MTJ devices in the form of 15-50 nm ovals. IPL (buffer head voltage) is plotted vs. RA value in FIG. 12. Results for a MTJ device comprising a Mg/Ta/Ru seed layer of the present disclosure are shown within circle 40 at RA=0.7 µohm-cm², and at point 41 at RA=0.8 µohm-cm². All other points on the plot are from the reference MTJ. An improvement in IPL BHV is observed for points within circle 40 in that a higher mV reading is achieved than for the reference points 42 at RA=0.7 µohm-cm². Likewise, a higher mV reading is found for point 41 than for the reference points within circle 43 at RA=0.8 µohm-cm². Thus, the MTJ devices with a seed layer formed according to the present disclosure demonstrate a higher lifetime than the MTJ devices with the reference seed layer stack. An improvement in device lifetime is achieved without compromising TMR ratio, RA, or pinning strength in the MTJ devices.

The seed layer stack of the embodiments described herein is formed by employing conventional processes and materials without any significant added cost and can readily be implemented in a manufacturing environment.

While this disclosure has been particularly shown and described with reference to, the preferred embodiment thereof, it will be understood by those skilled in the art that various changes in form and details may be made without departing from the spirit and scope of this disclosure.

We claim:

1. A seed layer stack in a magnetic element, the seed layer stack comprises:
    (a) a first seed layer (SL1) that is Mg, MgN, or a Mg alloy with one of Al, Ti, Ta, Hf, Cr, Zr, Nb, or Zn formed on a substrate and having a first bond energy;
    (b) a second seed layer (SL2) formed on the first seed layer and having a second bond energy substantially greater than the first bond energy; and
    (c) an uppermost template layer (TL) that is one or both of Cu and Ru on SL2 and having a top surface.

2. The seed layer stack of claim 1 wherein the magnetic element is a magnetic tunnel junction (MTJ) formed in a read head sensor, a spin transfer oscillator (STO) device, a magnetic random access memory (MRAM), a thermally assisted magnetic recording (TAMR) device, or a microwave assisted magnetic recording (MAMR) device.

3. The seed layer stack of claim 1 wherein the second seed layer is one of NiCr and Ta.

4. The seed layer stack of claim 1 wherein the first seed layer has a thickness from about 2 to 20 Angstroms.

5. The seed layer stack of claim 2 wherein the MTJ element further comprises a reference layer, a tunnel barrier, a free layer, and a capping layer sequentially formed on the top surface of the template layer.

6. The seed layer stack of claim 2 wherein the MTJ element further comprises a free layer, tunnel barrier, a reference layer, and a capping layer sequentially formed on the top surface of the template layer.

7. The seed layer stack of claim 1 wherein the top surface of the template layer has a peak to peak film thickness variation proximate to 0.5 nm over a 100 nm radius.

8. A seed layer stack in a magnetic element, the seed layer stack comprises:
   (a) a first seed layer (SL1) that is formed on a substrate and has a first bond energy;
   (b) a second seed layer (SL2) formed on SL1 and having a second bond energy substantially less than the first bond energy, the second seed layer is Mg, MgN, or a Mg alloy with one of Al, Ti, Ta, Hf, Cr, Zr, Nb, or Zn; and
   (c) an uppermost template layer (TL) that is one or both of Cu and Ru on SL2 and having a top surface.

9. The seed layer stack of claim 8 wherein the magnetic element is a MTJ formed in a read head sensor, a spin transfer oscillator (STO) device, a magnetic random access memory (MRAM), a thermally assisted magnetic recording (TAMR) device, or a microwave assisted magnetic recording (MAMR) device.

10. The seed layer stack of claim 8 wherein the first seed layer is one of NiCr and Ta.

11. The seed layer stack of claim 8 wherein the second seed layer has a thickness from about 2 to 20 Angstroms.

12. The seed layer stack of claim 9 wherein the MTJ element further comprises a reference layer, a tunnel barrier, a free layer, and a capping layer sequentially formed on the template layer.

13. The seed layer stack of claim 9 wherein the MTJ element further comprises a free layer, tunnel barrier, a reference layer, and a capping layer that are sequentially formed on the template layer.

14. The seed layer stack of claim 8 wherein the top surface of the template layer has a peak to peak film thickness variation proximate to 0.5 nm over a 100 nm radius.

15. A method of forming a magnetic tunnel junction (MTJ), comprising:
   (a) sputter depositing a seed layer stack on a substrate; the seed layer stack comprises:
      (1) a first seed layer that is Mg, MgN, or a Mg alloy with one of Al, Ti, Ta, Hf, Cr, Zr, Nb, or Zn; and
      (2) a second seed layer formed on the first seed layer, the second seed layer has a bond energy that is substantially greater than a bond energy of the first seed layer such that sputter deposition of the second seed layer results in removal of a top portion of the first seed layer to give a top surface on the seed layer stack that has a peak to peak thickness variation substantially less than a peak to peak thickness variation in the first seed layer prior to the deposition of the second seed layer;
   (b) forming a ferromagnetic layer having perpendicular magnetic anisotropy (PMA) above the second seed layer, the seed layer stack enhances PMA in the ferromagnetic layer; and
   (c) patterning the seed layer stack and the ferromagnetic layer with a process including an etching step thereby forming a sidewall that stops on the substrate.

16. The method of claim 15 wherein secondary ion mass spectrometry (SIMS) is employed to monitor a m/e signal of the first seed layer so that the sidewall stops within +/−2 Angstroms of a top surface of the substrate, and wherein m is the mass of ions generated by the etch step, and e is the electric charge of the ions.

17. The method of claim 15 wherein the seed layer stack is further comprised of forming a template layer on the second seed layer.

18. The method of claim 17 wherein the template layer is comprised of one or both of Ru and Cu.

19. The method of claim 15 wherein the second seed layer is one of NiCr and Ta.

20. The method of claim 15 wherein the first seed layer has a thickness of about 2 to 20 Angstroms.

21. The method of claim 15 wherein the ferromagnetic layer is a reference layer, and forming the MTJ further comprises sequentially depositing a tunnel barrier, a free layer, and a capping layer sequentially on the reference layer.

22. The method of claim 15 wherein the ferromagnetic layer is a free layer, and forming the MTJ further comprises sequentially depositing a tunnel barrier, a reference layer, and a capping layer sequentially on the reference layer.

23. A seed layer stack in a magnetic element, the seed layer stack comprises:
   (a) a first seed layer (SL1) that is Mg, MgN, or a Mg alloy with one of Al, Ti, Ta, Hf, Cr, Zr, Nb, or Zn formed on a substrate and having a first bond energy;
   (b) a second seed layer (SL2) formed on the first seed layer and having a second bond energy substantially greater than the first bond energy;
   (c) a third seed layer (SL1) on the second seed layer;
   (d) a fourth seed layer (SL2) on the third seed layer; and
   (e) an uppermost template layer (TL) on the fourth seed layer and having a top surface to give a SL1/SL2/SL1/SL2/TL seed layer configuration.

24. A seed layer stack in a magnetic element, the seed layer stack comprises:
   (a) a first seed layer (SL1) that is formed on a substrate and has a first bond energy;
   (b) a second seed layer (SL2) formed on SL1 and having a second bond energy substantially less than the first bond energy, the second seed layer is Mg, MgN, or a Mg alloy with one of Al, Ti, Ta, Hf, Cr, Zr, Nb, or Zn;
   (c) a third seed layer (SL1) on the second seed layer;
   (d) a fourth seed layer (SL2) on the third seed layer; and
   (e) an uppermost template layer (TL) on the fourth seed layer and having a top surface to give a SL1/SL2/SL1/SL2/TL configuration.

* * * * *